United States Patent [19]

Suzuki et al.

[11] 4,091,434
[45] May 23, 1978

[54] SURGE CURRENT PROTECTION CIRCUIT

[75] Inventors: Tadao Suzuki; Shigeaki Wachi, both of Tokyo, Japan

[73] Assignee: Sony Corporation, Tokyo, Japan

[21] Appl. No.: 731,766

[22] Filed: Oct. 12, 1976

[30] Foreign Application Priority Data

Oct. 16, 1975  Japan .................................. 50-124723

[51] Int. Cl.² ............................................. H02H 7/10
[52] U.S. Cl. ................................. 361/100; 330/207 P; 363/15; 363/53
[58] Field of Search ............................ 330/15, 207 P; 363/15-31, 45, 46, 49, 52, 53; 361/15, 100, 111

[56] References Cited

U.S. PATENT DOCUMENTS

| 3,377,540 | 4/1968 | Meyer | 363/22 |
| 3,401,327 | 9/1968 | Leppert | 363/49 |
| 3,419,781 | 12/1968 | Davin | 362/21 |
| 3,781,608 | 12/1973 | Geiger | 361/100 |
| 3,787,756 | 1/1974 | Berger | 363/53 |
| 3,792,289 | 2/1974 | Kazem | 361/100 |

Primary Examiner—Harry E. Moose, Jr.
Attorney, Agent, or Firm—Lewis H. Eslinger; Alvin Sinderbrand

[57] ABSTRACT

A surge current protection circuit includes an input terminal supplied with a rectified alternating voltage, an output terminal to be connected to a load, and a semiconductor controlled rectifier having its anode and cathode electrodes connected in series between the input and output terminals. The collector and emitter electrodes of a control transistor are connected between the gate and cathode electrodes of the rectifier. The base-emitter voltage is supplied with any sharp transients, and the transistor becomes conductive before the rectifier if the transients are sharp enough and of high enough amplitude. Conduction of the transistor prevents the semiconductor controlled rectifier from conducting surge currents and protects circuits connected in series with the rectifier.

9 Claims, 9 Drawing Figures

SURGE CURRENT PROTECTION CIRCUIT

BACKGROUND OF THE INVENTION

1. Field of the Invention

This invention relates to a surge current protection circuit, and more particularly to a surge current protection circuit using a semiconductor controlled rectifier.

2. Description of the Prior Art

Recently DC-DC converter circuits have begun to be used in power supply circuits of audio power amplifiers. Since a large current is required in such power supply circuits, care must be taken to limit or prevent a large current surge from flowing when the power supply circuit is turned on. This protects the smoothing capacitor of the current rectifier circuit and other components from being damaged.

OBJECTS AND SUMMARY OF THE INVENTION

Accordingly, an object of the present invention is to provide an improved surge current protection circuit.

Another object of the invention is to provide a surge current protection circuit in the form of a two-terminal circuit of simple construction.

A further object of the invention is to provide a surge current protection circuit which includes a semiconductor controlled rectifier and a transistor and is both simple and inexpensive to construct.

In accordance with one example of the present invention, a surge current protection circuit includes an input terminal supplied with a rectified voltage, an output terminal to be connected to a load, and a semiconductor controlled rectifier. The anode and cathode electrodes of the rectifier are connected in series between the input and output terminals. A triggering circuit is also connected between the input and output terminals for applying a trigger voltage to the gate electrode of the semiconductor controlled rectifier. The triggering circuit includes a transistor that has its collector and emitter electrodes connected between the gate and cathode electrodes of the semiconductor controlled rectifier. A biasing circuit for the transistor connected between the input and output terminals for applying to the base electrode of the transistor a bias voltage having a larger amplitude than that of the trigger voltage required to make the semiconductor controlled rectifier conductive. Further, the circuit that supplies the bias voltage to the transistor responds more quickly to transients than does the gate-cathode circuit of the semiconductor controlled rectifier. This allows the transistor to become conductive quickly enough to keep the semiconductor controlled rectifier from being conductive when the voltage at the input terminal of the triggering circuit suddenly exceeds a predetermined value.

Other objects, features and advantages of the present invention will become apparent from the following description taken in conjunction with the attached drawings.

DESCRIPTION OF THE PREFERRED EMBODIMENTS

An embodiment of the rush current protective circuit according to the present invention will be described with reference to FIG. 1.

Figure 1:
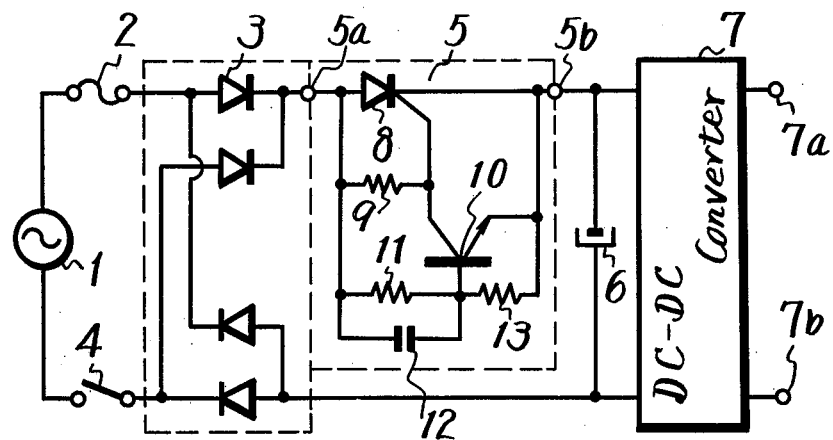
FIG. 1 is a circuit diagram showing an embodiment of the surge current protection circuit according to the invention.

In FIG. 1 a commercial AC power supply source 1 is connected through a fuse 2 to one input terminal of a full-wave rectifier circuit 3 and through a power supply switch 4 to the other input terminal of the rectifier circuit 3. One of the output terminals of the rectifier circuit 3 are connected through a protecting circuit 5 to one electrode of a smoothing capacitor 6, while the other output terminal of the rectifier circuit is connected directly to the other electrode of the smoothing capacitor. The smoothing capacitor 6 is connected across the input terminals of a DC-DC converter circuit 7 that has output terminals 7a and 7b.

The circuit 5 has an input terminal 5a connected to the anode of a semiconductor control rectifier element, such as a silicon controlled rectifier (which will be hereinafter referred to simply as SCR) 8, and an output terminal 5b to which the cathode of the SCR is connected. The input terminal 5a is also connected through a resistor 9 to the gate electrode of the SCR 8. The resistor 9 and the gate are connected to the collector of an NPN type transistor 10, and the emitter of the transistor is directly connected to the cathode of the SCR, thereby placing the collector-emitter circuit of the transistor 10 directly across the gate-cathode circuit of the SCR 8.

The input terminal 5a is also connected through a parallel circuit of a resistor 11 and speed-up capacitor 12 to the base of the transistor 10, and a resistor 13 is connected in series between the base and emitter of the transistor. The common circuit point of the emitter of the transistor, the cathode of the SCR and the resistor 13 are connected to the terminal 5b. The resistance value $R_2$ and $R_3$, respectively, of the resistors 11 and 13 is selected so that the voltage $V_{BE}$ at which the transistor 10 is made conductive is higher than the voltage $V_{GK}$ required to trigger the SCR 8. That is, the condition $V_{GK} < V_{BE} \cdot (R_2 + R_3/R_3)$ is satisfied.

Figure 2A:
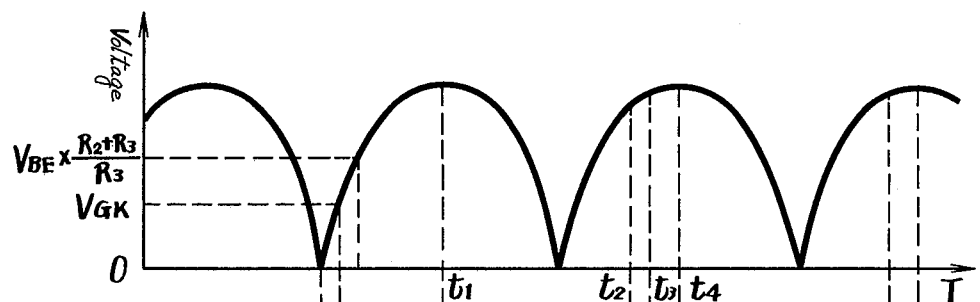
FIGS. 2A to 2E, inclusive, are waveform diagrams used for explaining the operation of the invention.

The operation of the circuit in FIG. 1 will now be described with reference to the waveforms in FIGS. 2A–2E. It will be assumed that the power supply switch 4 may be closed at any time within the alternating current cycle. In FIG. 2A the waveform indicates that the supply voltage at the time the switch 4 was closed was higher than the voltage $V_{BE} \cdot (R_2 + R_3/R_3)$. Closing the switch 4 suddenly applies this voltage to the circuit 5 and the sharp transient rise at the leading edge at the time $t = 0$ passes more quickly to the base of the transistor 10 than to the gate of the SCR 8. At least the transistor 10 becomes conductive, since the transient voltage applied to its base has sufficient magnitude, before the SCR 8 becomes conductive. When the transistor becomes conductive it operates as a virtual short circuit between the gate and cathode of the SCR and prevents the SCR from becoming conductive. Thus no current can pass through the circuit 5 to the converter circuit 7 immediately if the switch 4 happens to be closed at the time indicated by the waveform in FIG. 2A.

The transistor 10 remains conductive until the voltage applied at the input terminal 5a drops below the value $V_{BE} \cdot (R_2 + R_3/R_3)$. Then the transistor becomes non-conductive and its base-emitter voltage drops to zero as shown in FIG. 2C.

Figure 2B:
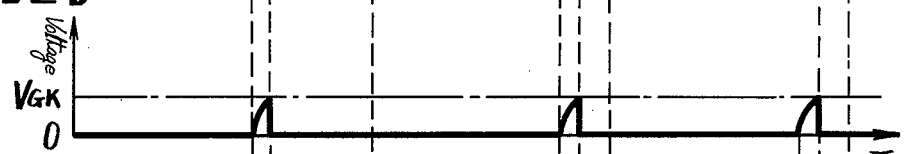
Figure 2C:
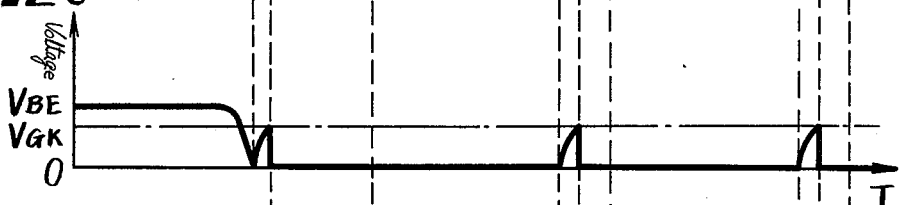

At the beginning of the second half cycle of the alternating voltage (or the first half cycle) as shown in FIG. 2A, the voltage rises relatively slowly according to the sinusoidal wave shape and the voltage at the terminal 5a reaches the value $V_{GK}$ as shown in FIGS. 2A–2C. Actually this voltage as it affects the SCR 8 is not the voltage with respect to the lower terminal of the capacitor 6 but is the voltage with respect to the terminal 5b. However, the capacitor 6 is uncharged at this time and thus the voltage at both of its terminals is substantially the same.

Figure 2D:
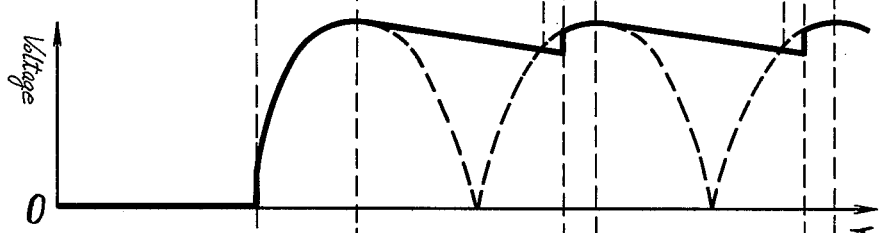

When the gate-cathode voltage of the SCR 8 reaches the triggering level $V_{GK}$ shown in FIGS. 2B and 2C, the SCR becomes conductive and the applied alternating voltage begins to charge the capacitor 6 as shown by the voltage waveform in FIG. 2D. During the first charging cycle the current through the SCR 8 has the waveform shown in FIG. 2E.

It will be noticed that the voltage applied to the base of the transistor 10 during the second half cycle of the alternating voltage never reaches a value sufficient to cause the transistor to become conductive. However, the SCR 8 does become conductive, as has just been described, and remains conductive until approximately the peak of the applied alternating voltage at the time $t_1$. Thereafter, as shown particularly in FIG. 2D, the applied voltage starts to drop off as indicated in dotted lines, but the capacitor 6 retains a sufficient charge so that the SCR 8 becomes reverse biased and therefore non-conductive. This is also indicated by the current flow in the SCR 8 during the first such current flow in FIG. 2E.

Figure 2E:
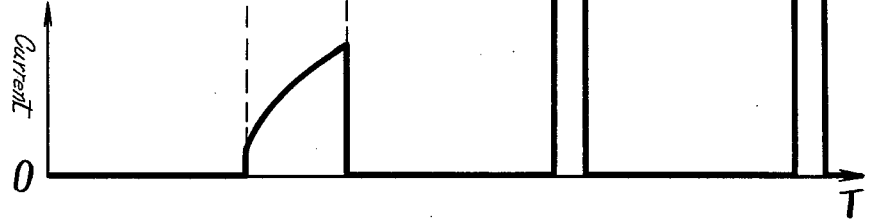

In the next half cycle of the applied alternating voltage across the gate and cathode electrodes of the SCR 8 will not begin to increase until the applied alternating voltage exceeds the decayed value of the voltage across the capacitor 6. From the time $t_2$ to the time $t_3$ the voltage between the gate and cathode of the SCR 8 increases as shown in FIGS. 2B and 2C. The time $t_3$ is determined by the voltage between the gate and cathode of the SCR 8 sufficient to equal the trigger voltage $V_{GK}$. The SCR 8 will then suddenly become conductive to allow charging current to pass through it to charge the capacitor 6. Thus current is illustrated in FIG. 2E and the voltage across the capacitor is illustrated in FIG. 2D between the times $t_3$ and $t_4$. Subsequent cycles of operation result in similar current pulses through the SCR 8, depending upon the amount of load and the capacitance of the capacitor 6. The voltage across the capacitor 6 as shown in FIG. 2D is the input voltage applied to the DC-DC converter 7.

As described above, with the circuit of the present invention, if the output voltage of the rectifier circuit 3 is high when the switch 4 is turned on, the transistor 10 operates to keep the SCR 8 non-conductive so that no large current flows through the circuit elements. It is not possible that, when the output voltage of the rectifier circuit 3 is greater than $V_{BE} \cdot (R_2 + R_3/R_3)$ at the instant when the power supply circuit is turned on, a voltage of high amplitude will be applied across the capacitor 6. For this reason, the power supply switch 4, the capacitor 6, and other electric elements need not be capable of handling large surge currents or voltages.

Figure 3:
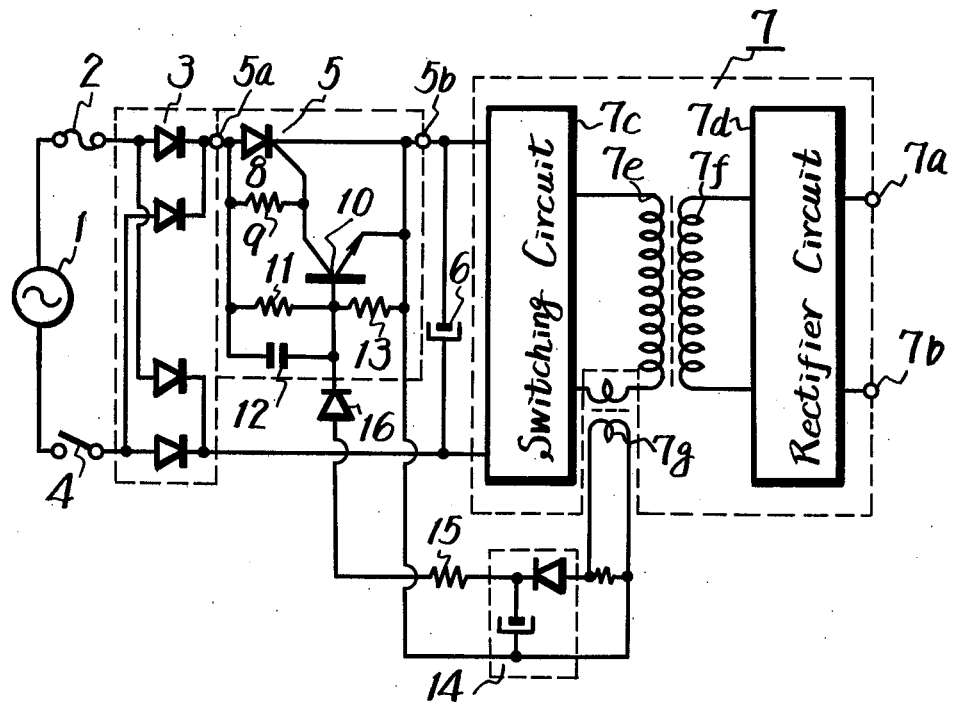
FIGS. 3 to 5 are circuit diagrams showing other embodiments of the invention.

Another embodiment of the invention will be described with reference to FIG. 3 in which the parts corresponding to those of FIG. 1 are marked with the same numerals and their description will be omitted. In FIG. 3 the DC-DC converter circuit 7 includes a switching circuit 7c and a second side rectifier circuit 7d. The output terminals of the switching circuit 7c are connected by a primary winding 7e and a secondary winding 7f of a transformer to the rectifier circuit 7d. A tertiary winding 7g is provided in association with the primary winding 7e of the transformer, and the voltage induced across the tertiary winding 7g is fed to a rectifier circuit 14. One terminal of the rectifier circuit 14 is connected to the base of the transistor 10 through a series connection of a resistor 15 and a diode 16, and the other end of the rectifier circuit 14 is connected to the emitter of the transistor 10. In this case, there is obtained at the output of the rectifier circuit 14 when an excess current flows through the primary winding 7e of the transformer or excess load appears a voltage higher than the conduction voltage $V_{BE}$ of the transistor 10. On the other hand, when the current through the winding 7e is normal, a voltage lower than the conduction voltage $V_{BE}$ of the transistor 10 is applied by the rectifier circuit 14 to the base of the transistor.

Operation of the embodiment of the invention shown in FIG. 3 is similar to that in FIG. 1. However, when the current flowing through the primary winding 7e in the DC-DC converter 7 becomes greater than a predetermined value, the path between the base and emitter electrodes of the transistor 10, which forms the protective circuit 5, is supplied with a voltage higher than the voltage $V_{BE}$ that makes the transistor 10 conductive. When the transistor 10 thus becomes conductive, the voltage between the gate and cathode of the SCR 8 are, in effect, short-circuited, and hence the SCR 8 is made non-conductive. As a result, in such a case the circuits beyond the protective circuit 5 can be protected.

A further embodiment of this invention will be described with reference to FIG. 4 in which reference numerals the same as those used in FIGS. 1 and 3 designate the same elements and parts and their detailed description will be omitted. The circuit shown in FIG. 4 is to protect an output amplifier by making the SCR 8 non-conductive when the output amplifier is overloaded.

Figure 4:
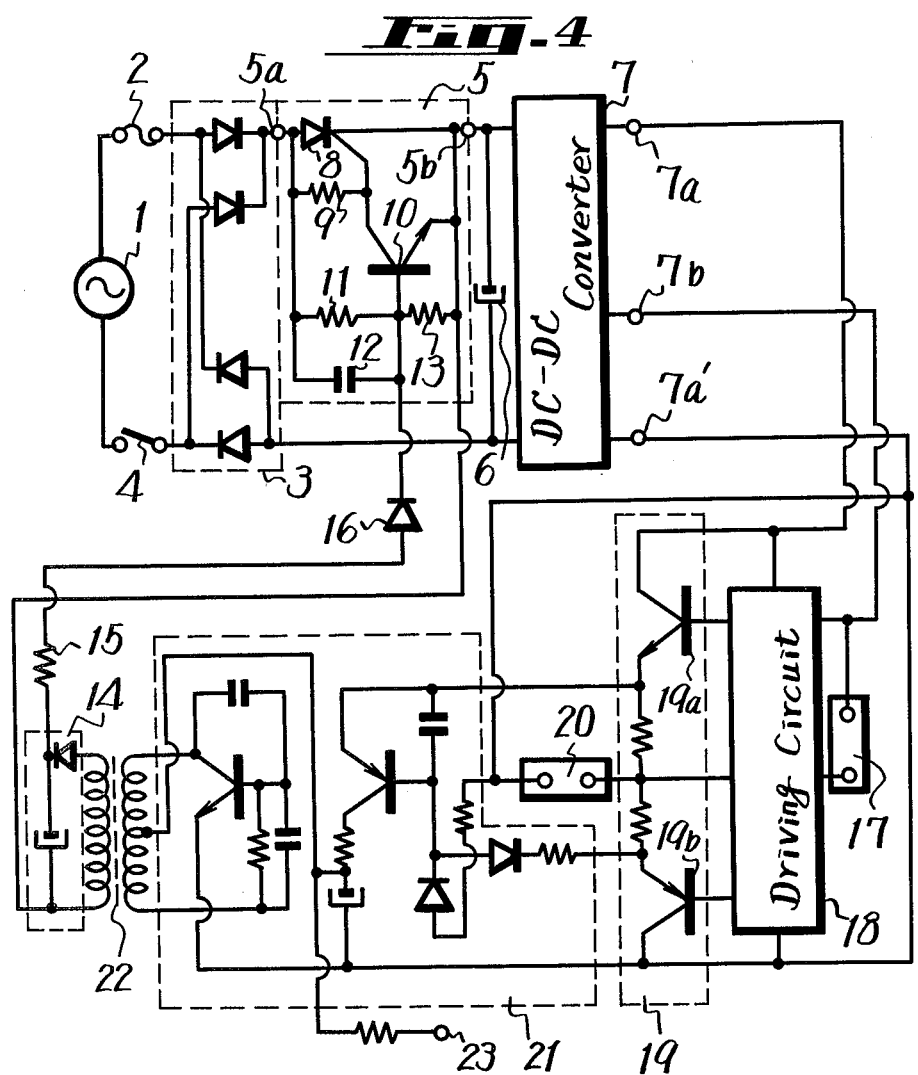
Figure 5:
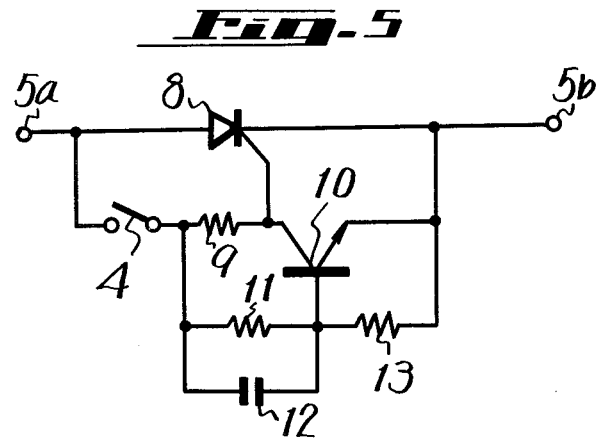

In FIG. 4, an audio signal input terminal 17 receives the audio signal for a driving circuit 18. The output signal of the driving circuit is applied to a power amplifier 19 which includes a pair of transistors 19a and 19b connected in pushpull. The amplifier 19 has an output terminal 20 for connection to a speaker or other load device (not shown). An overload detecting circuit 21 is provided which detects an overloaded condition by measuring the current supplied to the speaker or other load device and supplies its detected output signal through a transformer 22 to the rectifier circuit 14. The rectifier 14 and the other circuit construction of the circuit in FIG. 4 is substantially the same as that of FIG. 3. In FIG. 4, however, the DC-DC converter circuit 7 has a third output terminal 7a', which is different from the DC-DC converter 7 in FIG. 3. In FIG. 5 the output terminal 7a has a voltage of $+B$, the output terminal 7a' has a voltage of $-B$, and the output terminal 7b has a voltage of zero.

The circuit of FIG. 4 operates in a manner similar to that of FIG. 3 and, in addition when an overload is applied to the output amplifier 19, the transistor 10 is made conductive to make the SCR 8 non-conductive and hence to prevent the power from being supplied to the circuits beyond the protective circuit 5. As a result, the output amplifier 19 and speakers or other devices connected to it can be protected.

The circuit in FIG. 4 may also include an input terminal 23 which is supplied with the currents flowing through the output amplifiers of other channels in a multi-channel system. Thus, when the currents corresponding to overloads in the other channels are supplied to the terminal 23, such currents are detected and the same operation is carried out to protect the output amplifiers belonging to the other channels.

If, in the protective circuit shown in FIG. 1, the power source switch is a switch 4' provided between the connection point of the resistors 9 and 11 and the anode of the SCR 8 as shown in FIG. 5, the SCR 8 can be made non-conductive by turning the switch 4' off. This permits a switch having only a low normal current-carrying capacity to be used as the power source switch, which is advantageous.

In the above examples, the SCR 8 is referred to but may be apparent that a thyristor or a related semiconductor device can be used in place of the SCR 8.

It will be understood that many modifications and variations could be effected by one skilled in the art without departing from the spirit or scope of the present invention, so that the true scope of the invention is to be determined only by the following claims.

What is claimed is:

1. A surge current protection circuit comprising an input terminal supplied with a rectified voltage, an output terminal to be connected to a load, a semiconductor controlled rectifier comprising gate, anode, and cathode electrodes, the anode and cathode electrodes being connected in series between said input and output terminals, and triggering means connected between said input and output terminals to supply a trigger voltage to the gate electrode of said semiconductor controlled rectifier, said triggering means comprising:

a first resistor connected in series between the gate and anode electrodes of said semiconductor controlled rectifier to supply a trigger voltage to said gate;

a transistor having base, emitter, and collector electrodes, the collector and emitter electrodes of said transistor being connected in series between the gate and cathode electrodes of said semiconductor controlled rectifier; and biasing means comprising a series circuit connected between said input and output terminals for applying a bias voltage to the base electrode of said transistor, said series circuit comprising second and third resistors, said third resistor being connected between the base and emitter electrodes of said transistor, and said bias voltage across said third resistor being larger than the trigger voltage of said semiconductor controlled rectifier so as not to allow said semiconductor controlled rectifier to conduct when the voltage difference between said input and output terminals exceeds a predetermined value.

2. A surge current protection circuit according to claim 1 further comprising a speed-up capacitor connected in series between said input terminal and the base electrode of said transistor.

3. A surge current protection circuit according to claim 1 in which the resistance value of said second and third resistors is determined by the following equation:

$$V_{GK} < (R_2 + R_3/R_3) \times V_{BE}$$

wherein $R_2$ and $R_3$ indicate resistance values of the second and third resistors, respectively, $V_{BE}$ indicates the voltage between the base and emitter electrodes of said transistor and $V_{GK}$ indicates the gate trigger voltage of said silicon controlled rectifier.

4. A surge current protection circuit according to claim 3 further comprising a rectifier circuit and a filter capacitor, said rectifier, the anode-cathode circuit of said semiconductor controlled rectifier, and said capacitor being in series to form a closed loop.

5. A surge current protection circuit according to claim 4 further comprising a DC-DC converter the input terminals of which are connected across said capacitor.

6. A surge current protection circuit according to claim 5 in which said DC-DC converter comprises a transformer that comprises a primary winding, said circuit further comprising detecting means for detecting a current flowing through said primary winding and producing a control signal proportional to said current, said detecting means being connected to said transistor to apply a control signal to the base of said transistor so as to cause said transistor to conduct when the current flowing through the primary winding exceeds a predetermined value.

7. A surge current protection circuit according to claim 6 in which said detecting means comprises a detecting coil provided in connection with the primary winding of said DC-DC converter, a rectifiying circuit supplied with an output signal from said detecting coil, the output of said rectifying circuit being applied to the base of said transistor.

8. A surge current protection circuit according to claim 5 further comprising an amplifier connected to said DC-DC converter, and an overload detecting circuit for detecting an overload state of said amplifier and having an output terminal coupled to the base of said transistor so as to cause said transistor to conduct when an overload state is present in said amplifier.

9. A surge current protection circuit according to claim 8 in which said amplifier comprises a push-pull transistor amplifier and a load therefor, and said overload detecting circuit detects an overload state of said push-pull amplifier by comparing the load current flowing through at least one transistor of said push-pull amplifier and the voltage across a load connected to the output of said push-pull transistor amplifier.

* * * * *